US010666250B2

(12) United States Patent
Nakashima (10) Patent No.: US 10,666,250 B2
(45) Date of Patent: May 26, 2020

(54) DRIVE DEVICE FOR SEMICONDUCTOR ELEMENT

(71) Applicant: Mitsubishi Electric Corporation, Tokyo (JP)

(72) Inventor: Takaki Nakashima, Fukuoka (JP)

(73) Assignee: Mitsubishi Electric Corporation, Tokyo (JP)

(*) Notice: Subject to any disclaimer, the term of this patent is extended or adjusted under 35 U.S.C. 154(b) by 0 days.

(21) Appl. No.: 16/190,283

(22) Filed: Nov. 14, 2018

(65) Prior Publication Data

US 2019/0229723 A1 Jul. 25, 2019

(30) Foreign Application Priority Data

Jan. 23, 2018 (JP) .................................. 2018-009037

(51) Int. Cl.
*H03K 17/567* (2006.01)
*H03K 17/16* (2006.01)
*H03K 17/082* (2006.01)

(52) U.S. Cl.
CPC ....... *H03K 17/567* (2013.01); *H03K 17/0822* (2013.01); *H03K 17/163* (2013.01); *H03K 17/165* (2013.01); *H03K 17/166* (2013.01)

(58) Field of Classification Search
CPC ............. H03K 17/567; H03K 17/0812; H03K 17/08122; H03K 17/082; H03K 17/0822; H03K 17/16; H03K 17/161; H03K 17/165; H03K 17/163; H03K 17/166; H03K 17/687
See application file for complete search history.

(56) References Cited

U.S. PATENT DOCUMENTS

| 10,291,222 B2* | 5/2019 | Morishita ........ H03K 17/08122 |
| 2007/0008679 A1 | 1/2007 | Takahasi et al. |
| 2014/0253184 A1 | 9/2014 | Yamauchi et al. |

FOREIGN PATENT DOCUMENTS

| JP | 2001-352748 A | 12/2001 |
| JP | 2004-266368 A | 9/2004 |
| JP | 2014-176228 A | 9/2014 |

* cited by examiner

*Primary Examiner* — Jung Kim
(74) *Attorney, Agent, or Firm* — Studebaker & Brackett PC (57) ABSTRACT

According to a drive control signal for controlling a semiconductor element to be turned on and off, a current output circuit supplies an output current for charging a gate when the semiconductor element is turned on. A Miller voltage detection circuit outputs a detection signal for a constant voltage period during which a temporal change rate of a gate voltage is lower than a threshold value. Based on a drive control signal and a detection signal, a signal generation circuit generates a capability change signal for controlling a current output capability of the current output circuit. The signal generation circuit generates the capability change signal such that the current output capability is increased upon detection of the constant voltage period by the Miller voltage detection circuit, after the semiconductor element is instructed to be turned on by a level change of the drive control signal.

9 Claims, 5 Drawing Sheets

DRIVE DEVICE FOR SEMICONDUCTOR ELEMENT

BACKGROUND OF THE INVENTION

Field of the Invention

The present disclosure relates to a drive device for a semiconductor element, and more particularly to a technique for turning on and off a voltage-driven semiconductor element.

Description of the Background Art

For the switching operation of a voltage-driven semiconductor element represented by a metal-oxide-semiconductor field-effect transistor (MOS-FET) and an insulated gate bipolar transistor (IGBT), a drive device configured to charge and discharge a gate of the semiconductor element in response to an on/off control signal is applied.

It is known that, during the above-described switching operation, a trade-off relation is established between the magnitude of the power loss (the so-called switching loss) in the semiconductor element and the magnitude of the electromagnetic noise generated by the semiconductor element. Specifically, when the rate at which the gate is charged/discharged is increased in order to reduce the switching loss, the electromagnetic noise is increased. On the other hand, when the rate at which the gate is charged/discharged is decreased in order to reduce the electromagnetic noise, the switching loss is increased.

It is known that, when the voltage-driven element is turned on and off, the Miller period occurs during which a gate voltage does not temporarily change. Particularly, in the case of an IGBT as a representative of a power semiconductor element, it is known that occurrence of the Miller period is remarkable when the IGBT is turned on.

Japanese Patent Laying-Open No. 2014-176228 discloses that the switching characteristics are improved by changing the gate drive voltage before and after the Miller period, and also discloses a gate drive circuit for changing the drive voltage in a simple circuit configuration.

SUMMARY OF THE INVENTION

In the gate drive circuit disclosed in Japanese Patent Laying-Open No. 2014-176228, based on the presumption of the timing at which the Miller period occurs, the timing of switching the drive voltage is controlled in accordance with the time period elapsed since the element is started to be turned on. Accordingly, it is feared that the adjustment load may increase due to characteristics variations in elements in the semiconductor element and the drive circuit. Furthermore, when dynamic operation variations occur in the semiconductor element and the drive circuit due to the temperature conditions and the like, there may be a case where desired switching characteristics cannot be achieved even by changing the drive voltage in accordance with the lapse of the preset fixed time period. On the other hand, it is not preferable that the circuit configuration is complicated for detection of the Miller period.

The present disclosure has been made in order to solve the above-described problems. An object of the present disclosure is to provide a drive device for a semiconductor element, for which a switching loss can be reliably reduced by changing the gate driving capability of the semiconductor element at an appropriate timing.

In an aspect of the present disclosure, a drive device for a semiconductor element includes a current output circuit, a detection circuit, and a signal generation circuit. In accordance with a drive control signal for controlling the semiconductor element to be turned on and off, the current output circuit outputs a charge current to a gate of the semiconductor element when the semiconductor element is turned on. The drive control signal is set at a first level when the semiconductor element is turned off, and set at a second level when the semiconductor element is turned on. The detection circuit detects a constant voltage period during which a temporal change rate of a voltage on the gate is lower than a threshold value. The signal generation circuit generates, based on a detection signal output from the detection circuit and the drive control signal, a capability change signal for controlling a current output capability of the current output circuit. The signal generation circuit generates the capability change signal so as to increase the current output capability upon detection of the constant voltage period by the detection circuit, after the drive control signal changes from the first level at which the semiconductor element is instructed to be turned off to the second level at which the semiconductor element is instructed to be turned on.

The foregoing and other objects, features, aspects and advantages of the present disclosure will become more apparent from the following detailed description of the present disclosure when taken in conjunction with the accompanying drawings.

DESCRIPTION OF THE PREFERRED EMBODIMENTS

Embodiments of the present disclosure will be hereinafter described in detail with reference to the accompanying drawings. In the following description, the same or corresponding components are designated by the same reference characters, and description thereof will not be basically repeated.

First Embodiment (Description of Comparative Example)

Before explaining the configuration of a drive device for a semiconductor element according to the present embodiment, a general configuration example of a drive device for a voltage-driven semiconductor element will be described as a comparative example.

Figure 1:
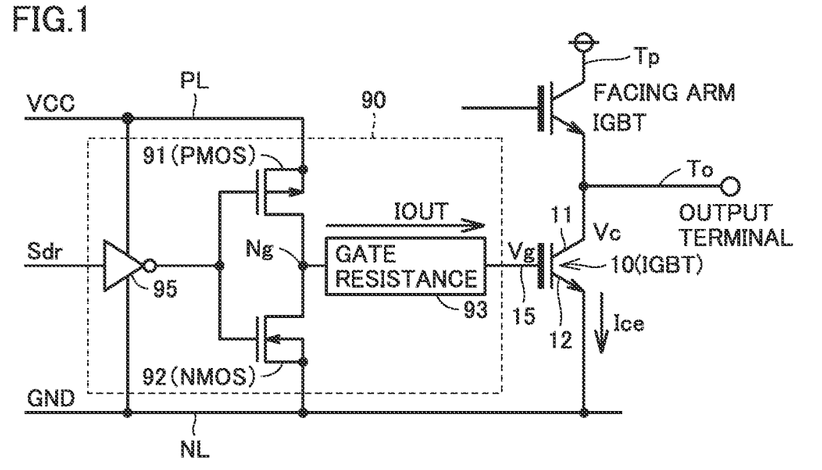
FIG. 1 is a circuit diagram showing the circuit configuration of a drive device according to a comparative example.

FIG. 1 is a circuit diagram showing the circuit configuration of a drive device according to a comparative example.

Referring to FIG. 1, a drive device 90 according to a comparative example is configured to control a semiconductor element 10 to be turned on and off (that is, control the switching operation of semiconductor element 10) according to a drive control signal Sdr from a control circuit (not shown). Semiconductor element 10 is a voltage-driven power semiconductor element, for which an insulated gate bipolar transistor (IGBT) is representatively applied.

Semiconductor element 10 includes a collector 11 and an emitter 12 each serving as a main electrode, and a gate 15 serving as a control electrode. Emitter 12 is connected to a voltage line NL on the low voltage side (which will be hereinafter also referred to as a "low voltage line NL"). Collector 11 is connected to an output terminal To. Another semiconductor element (IGBT) that forms a facing arm of semiconductor element 10 (IGBT) is further connected between output terminal To and a power supply line Tp.

Semiconductor element 10 is controlled to be an ON state and an OFF state in accordance with the gate-emitter voltage (which will be hereinafter also simply referred to as a "gate voltage Vg"). In the ON state, a current is generated between collector 11 and emitter 12. In the OFF state, an interruption occurs between collector 11 and emitter 12. Drive device 90 controls the gate voltage such that semiconductor element 10 is turned on and off according to drive control signal Sdr.

The gate voltage is defined by the voltage difference of gate 15 relative to emitter 12. The voltage difference of collector 11 relative to emitter 12 will be hereinafter also referred to as a "collector voltage Vc". Also, the current flowing between collector 11 and emitter 12 will be hereinafter also referred to as an "emitter current Ice". In semiconductor element 10, Ice=0 in the OFF state while voltage Vc=0 in the ON state.

Drive control signal Sdr is set at "0" in the time period during which semiconductor element 10 should be turned off, and set at "1" in the time period during which semiconductor element 10 should be turned on. In other words, the drive control signal is a binary signal that is set at one of: "0" corresponding to the "first level"; and "1" corresponding to the "second level". For example, drive control signal Sdr is generated such that semiconductor element 10 is operated to be ON and OFF under the pulse-width-modulation (PWM) control.

Semiconductor element 10 is turned on when gate voltage Vg reaches a positive voltage exceeding a prescribed threshold voltage. Thus, in the time period during which drive control signal Sdr is "1", drive device 90 drives gate 15 such that the gate voltage reaches a positive voltage exceeding a threshold voltage. On the other hand, in the time period during which drive control signal Sdr is "0", drive device 100 shown in FIG. 3 of the present embodiment drives gate 15 such that the gate voltage reaches the voltage equal to or less than the threshold voltage (for example, zero or a negative voltage).

When drive control signal Sdr changes from "0" to "1", drive device 100 drives gate 15 to raise the gate voltage in order to switch semiconductor element 10 from the OFF state to the ON state, that is, to perform the so-called turn-on operation. In other words, when semiconductor element 10 is turned on, drive device 90 charges gate 15.

On the other hand, when drive control signal Sdr changes from "1" to "0", drive device 100 drives gate 15 to lower the gate voltage in order to switch semiconductor element 10 from the ON state to the OFF state, that is, to perform the turn-off operation. In other words, when semiconductor element 10 is turned off, drive device 100 discharges gate 15.

Drive device 90 includes: a transistor 91 (a P-type metal oxide semiconductor: PMOS) and a transistor 92 (an N-type metal oxide semiconductor: NMOS) that are inverter-connected; a gate resistance 93; and an inverter 95.

Transistors 91 and 92 are connected in series through a node Ng between a high voltage line PL through which a voltage VCC is supplied and a low voltage line NL through which a ground voltage GND is supplied. Gate resistance 93 is electrically connected between gate 15 of semiconductor element 10 and node Ng. Transistors 91 and 92 have gates to which drive control signal Sdr inverted by inverter 95 is input in common. The voltage to be supplied through low voltage line NL may be a voltage other than ground voltage GND as long as the voltage is lower than VCC.

In the time period during which drive control signal Sdr is "1", transistor 91 (PMOS) is turned on. Accordingly, gate 15 is charged through the path extending from high voltage line PL through gate resistance 93 and node Ng. Thereby, the gate voltage exceeds a threshold voltage, so that semiconductor element 10 is turned on.

On the other hand, in the time period during which drive control signal Sdr is "0", transistor 92 (NMOS) is turned on. Accordingly, gate 15 is discharged through the path extending through gate resistance 93 and node Ng to low voltage line NL. Thereby, when gate voltage Vg lowers to ground voltage GND and falls below the threshold voltage, semiconductor element 10 is turned off. When gate voltage Vg=0, that is, when the potential of the gate becomes equivalent to ground voltage GND, semiconductor element 10 is completely turned off.

When the level of drive control signal Sdr changes, that is, when charging or discharging by transistor 91 or 92 is started, the current driving power by transistors 91 and 92 becomes maximum. Thus, it is feared that noise may be generated by sudden current supply and sudden voltage change. Accordingly, in drive device 90, gate resistance 93 is interposed to limit the charge current and the discharge current so as to suppress gate voltage variations, thereby taking measures against noise.

Figure 2:
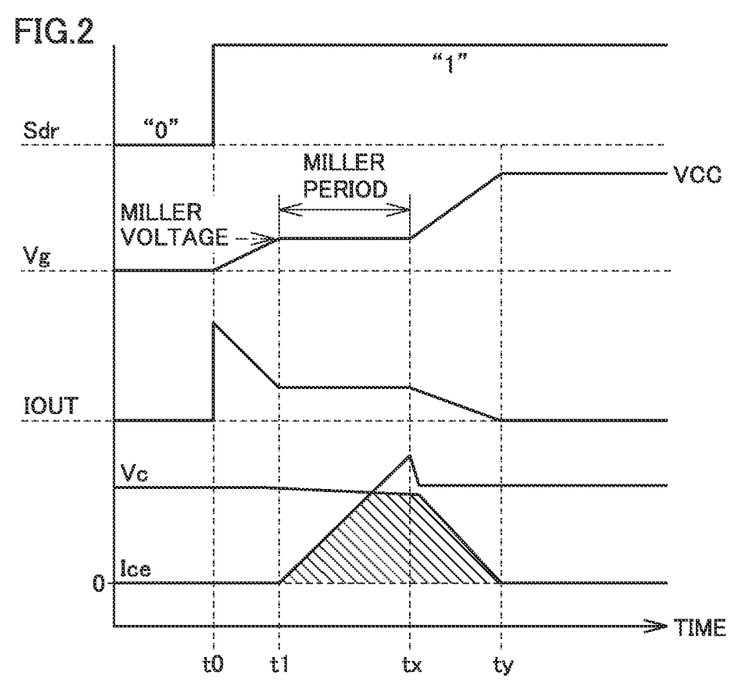
FIG. 2 shows an example of an operation waveform occurring when a semiconductor element is turned on by the drive device according to the comparative example.

FIG. 2 shows an example of an operation waveform occurring when semiconductor element 10 is turned on by drive device 90 according to the comparative example.

Referring to FIG. 2, at time t0, when drive control signal Sdr changes from "0" to "1", the turn-on operation is started. From time t0, an output current IOUT of drive device 90 that is supplied through gate resistance 93 to gate 15 rises. When charging of gate 15 progresses due to output current IOUT, gate voltage Vg gradually rises.

It is known that, particularly when the voltage-driven semiconductor element including an IGBT as a representative example is turned on, gate voltage Vg does not change even if the charge current is continuously supplied to the gate, that is, the Miller period occurs.

Occurrence of the Miller period results from the fact that the parasitic capacitance (gate capacitance) of gate 15 is not constant but has dependency upon collector voltage Vc. Particularly when collector voltage Vc starts to fall, the feedback capacitance between the gate and the collector and the output capacitance between the collector and the emitter are added to the gate capacitance as an apparent gate capacitance (that is, the Miller capacitance). As a result, gate voltage Vg stops rising and shifts at an approximately fixed value until charging of the Miller capacitance by the charge current (IOUT) completes.

In the example in FIG. 2, during time t1 to time tx, the Miller period occurs in which gate voltage Vg does not rise in the state where the charge current (IOUT) is continuously supplied. Gate voltage Vg in the Miller period is also referred to as the Miller voltage. When charging of the Miller capacitance completes and the Miller period ends, gate voltage Vg resumes rising due to charging by output current IOUT. Then, at time ty at which gate voltage Vg reaches voltage VCC and becomes saturated, semiconductor element 10 is completely turned on (Vc=0).

As shown by diagonal lines in FIG. 2, switching loss occurs in semiconductor element 10 in accordance with the product of collector voltage Vc and emitter current Ice. In drive device 90, output current IOUT is limited by gate resistance 93. Accordingly, the noise occurring immediately after time t0 can be suppressed, whereas the Miller period is lengthened. As a result, it is feared that the time period until semiconductor element 10 is completely turned on (reaches Vc=0) may be lengthened, so that the switching loss may also be increased.

(Drive Device According to First Embodiment)

Figure 3:
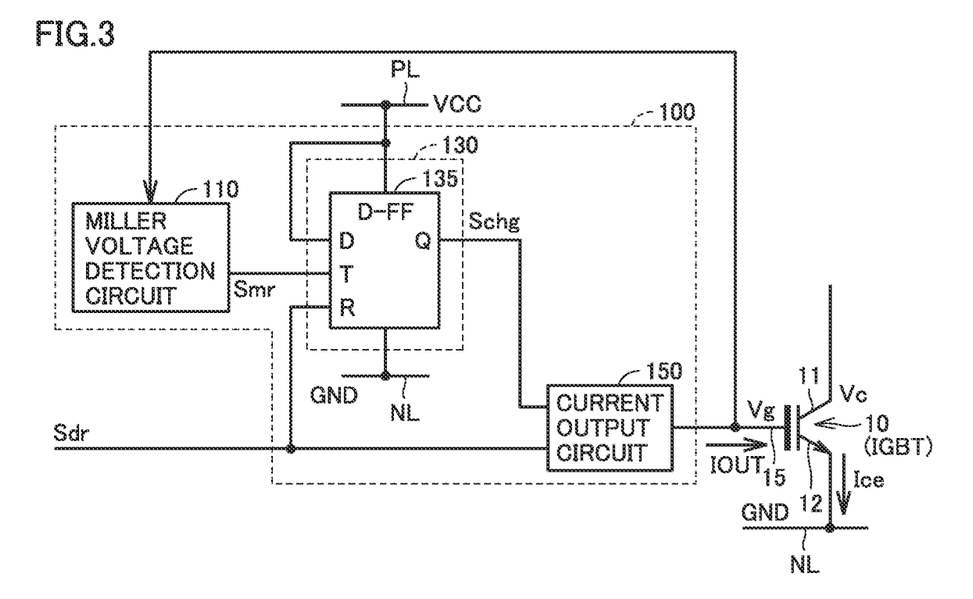
FIG. 3 is a block diagram showing the configuration of a drive device according to the first embodiment.

FIG. 3 is a block diagram showing the configuration of drive device 100 according to the first embodiment.

Referring to FIG. 3, drive device 100 according to the first embodiment includes a Miller voltage detection circuit 110, a signal generation circuit 130, and a current output circuit 150. Miller voltage detection circuit 110 is electrically connected to gate 15. Based on the behavior of gate voltage Vg, Miller voltage detection circuit 110 generates a detection signal Smr used for detecting the Miller period. Detection signal Smr is a binary signal that is set at one of "0" and "1". Miller voltage detection circuit 110 corresponds to one embodiment of the "detection circuit".

Based on detection signal Smr and drive control signal Sdr, signal generation circuit 130 generates a capability change signal Schg for controlling the current output capability of current output circuit 150 to be changed. Capability change signal Schg is a binary signal that is set at one of "0" corresponding to the "first level" and "1" corresponding to the "second level".

For example, signal generation circuit 130 is formed of a D flip-flop 135. The D flip-flop has: a D terminal to which voltage VCC corresponding to the level of "1" is constantly input; a T terminal to which detection signal Smr is input from Miller voltage detection circuit 110; and an R (reset) terminal to which drive control signal Sdr is input.

Thereby, when drive control signal Sdr changes from "1" to "0", capability change signal Schg output from signal generation circuit 130 is reset to "0" corresponding to a default value. On the other hand, capability change signal Schg changes from "0" to "1", which is triggered not when drive control signal Sdr changes from "0" to "1" but when detection signal Smr changes from "0" to "1".

Current output circuit 150 generates output current IOUT so as to charge or discharge gate 15 according to drive control signal Sdr. Furthermore, when semiconductor element 10 is turned on, the current output capability of current output circuit 150 is changed at two stages according to capability change signal Schg.

Figure 4:
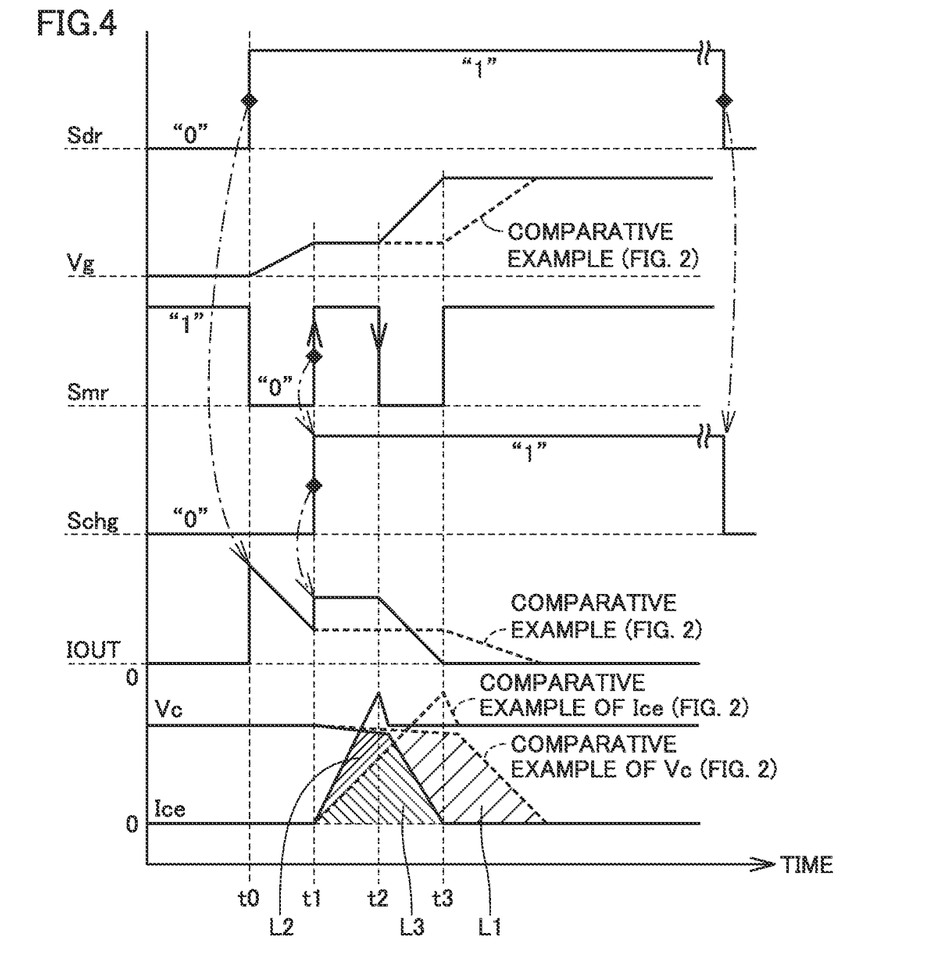
FIG. 4 shows an example of an operation waveform occurring when a semiconductor element is turned on by the drive device according to the first embodiment.

FIG. 4 shows an example of an operation waveform occurring when the semiconductor element is turned on by the drive device according to the first embodiment shown in FIG. 3.

Referring to FIG. 4, at time t0 when drive control signal Sdr changes from "0" to "1", semiconductor element 10 is started to be turned on. From time t0, current output circuit 150 also starts to supply output current IOUT. During time t0 to t1, gate voltage Vg rises as in FIG. 2. In the time period during which gate voltage Vg rises, detection signal Smr is set at "0".

As in FIG. 2, from time t1, gate voltage Vg stops rising and the Miller period is started. When the gate voltage stops changing, Miller voltage detection circuit 110 changes detection signal Smr from "0" to "1".

Capability change signal Schg is set at "0" at the time when semiconductor element is started to be turned on (time t0). Furthermore, capability change signal Schg changes from "0" to "1" as detection signal Smr changes from "0" to "1" (time t1).

Figure 5:
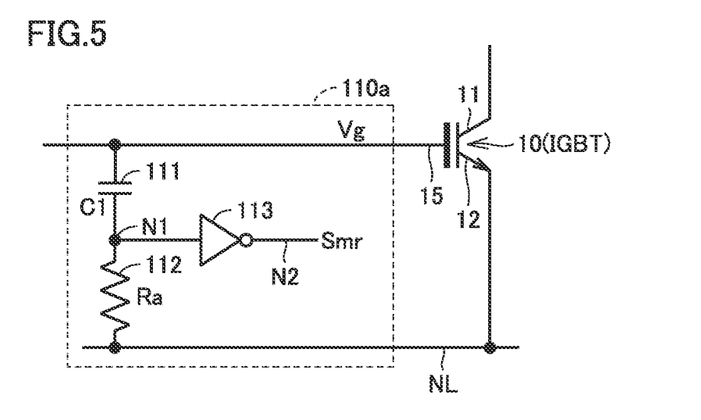
FIG. 5 is a circuit diagram illustrating the first configuration example of a Miller voltage detection circuit shown in FIG. 3.
Figure 6:
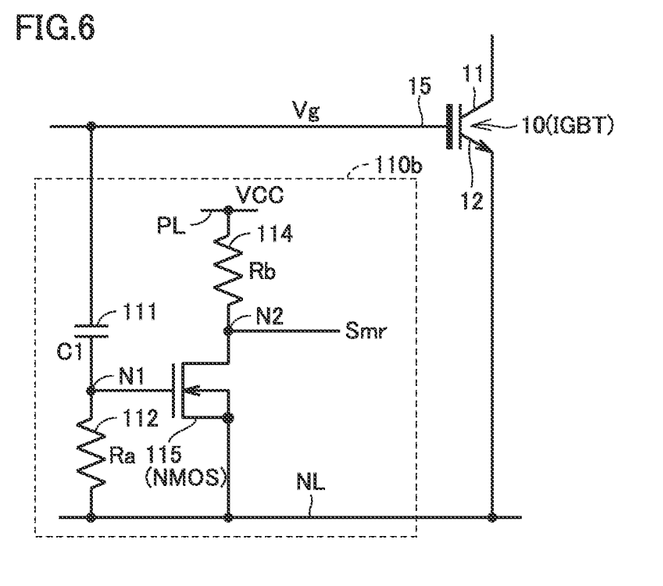
FIG. 6 is a circuit diagram illustrating the second configuration example of the Miller voltage detection circuit shown in FIG. 3.

FIGS. 5 and 6 each show a configuration example of Miller voltage detection circuit 110.

Referring to FIG. 5, Miller voltage detection circuit 110a according to the first configuration example includes a capacitor 111 and a resistance element 112, and an inverter 113. Capacitor 111 (a capacitance value C1) and resistance element 112 (an electric resistance value Ra) are connected in series through a node N1 between gate 15 and low voltage line NL to form a differential circuit of gate voltage Vg. Inverter 113 outputs detection signal Smr to a node N2 according to the voltage on node N1 that is a connection node between capacitor 111 and resistance element 112.

In the time period during which gate voltage Vg is constant, that is, during which the voltage change rate is relatively small, the voltage on node N1 becomes equal to ground voltage GND on low voltage line NL. Since the output from inverter 113 is at a logic high level at this time, detection signal Smr is set at "1".

On the other hand, in the time period during which gate voltage Vg rises, a voltage occurs on node N1 in accordance with the temporal change rate (i.e., differential value) of gate voltage Vg. When the voltage on node N1 rises above a threshold voltage Vt of inverter 113, detection signal Smr from inverter 113 is set at "0".

In this way, in Miller voltage detection circuit 110a, when the temporal change rate of gate voltage Vg is greater than a threshold value Vr, detection signal Smr is set at "0". On the other hand, in the time period (including the Miller period) during which the temporal change rate of gate voltage Vg is lower than threshold value Vr, detection signal Smr is set at "1".

In this way, Miller voltage detection circuit 110a does not detect the Miller period itself, but detects a "constant voltage period" during which the temporal change rate of gate voltage Vg (a differential value) is smaller than a threshold value, which can therefore be implemented in a relatively simple circuit configuration. In addition, threshold value Vr for detecting the constant voltage period can be adjusted by capacitance value C1 (capacitor 111), electric resistance value Ra (resistance element 112), and threshold voltage Vt (inverter 113).

By a combination of drive control signal Sdr and detection signal Smr in the constant voltage period, signal generation circuit 130 can detect the timing at which the Miller period is started when the semiconductor element is turned on. Specifically, the start of the Miller period can be detected at the timing when detection signal Smr changes from "0" to "1" after drive control signal Sdr changes from "0" to "1". As described above, signal generation circuit 130 changes capability change signal Schg from "0" to "1" in response to the start of the Miller period.

Referring to FIG. 6, a Miller voltage detection circuit 110b according to the second configuration example includes a capacitor 111 and a resistance element 112, and a resistance element 114 and a transistor 115 (NMOS). Resistance element 114 is connected between high voltage line PL and node N2. Transistor 115 is connected between node N2 and low voltage line NL. Transistor 115 has a gate connected to node N1.

Capacitor 111 and resistance element 112 form a differential circuit as in Miller voltage detection circuit 110a. Accordingly, a voltage occurs on node N1 in accordance with the differential value of gate voltage Vg.

When the voltage on node N1 is lower than the threshold voltage of transistor 115, transistor 115 is turned off. Thus, detection signal Smr generated on node N2 is set at "1". On the other hand, when the voltage on node N1 is higher than the threshold voltage of transistor 115, transistor 115 is turned on. Thus, detection signal Smr generated on node N2 is set at "0".

Thus, also in Miller voltage detection circuit 110b according to the second configuration example, when semiconductor element 10 is turned on, detection signal Smr is set at "0" in the time period during which gate voltage Vg rises (time t0 to time t1), whereas detection signal Smr is set at "1" in the Miller period (time t1 to time t2). Furthermore, during the time period from the end of the Miller period until semiconductor element 10 is completely turned on (time t2 to time t3), detection signal Smr is set at "0". Also, at and after time t3, detection signal Smr is set at "1".

In this way, based on the comparison between the temporal change rate of gate voltage Vg and threshold value Vr, Miller voltage detection circuits 110a and 110b can similarly generate detection signal Smr for the time period during which gate voltage Vg rises and also for the time period during which gate voltage Vg is constant. Particularly, in Miller voltage detection circuit 110b in FIG. 6, the threshold voltage that is compared with the voltage on node N1 becomes equivalent to the threshold voltage of the NMOS transistor. Thus, threshold value Vr that is compared with the temporal change rate of gate voltage Vg can be readily set at a small value. As a result, even when the temporal change rate of gate voltage Vg is relatively small, the start of the Miller period can be reliably detected. Also in Miller voltage detection circuit 110b, threshold value Vr can be adjusted by capacitance value C1 (capacitor 111), electric resistance value Ra (resistance element 112), and threshold voltage (transistor 115).

Then, the configuration example of current output circuit 150 will be hereinafter described with reference to FIG. 7.

Figure 7:
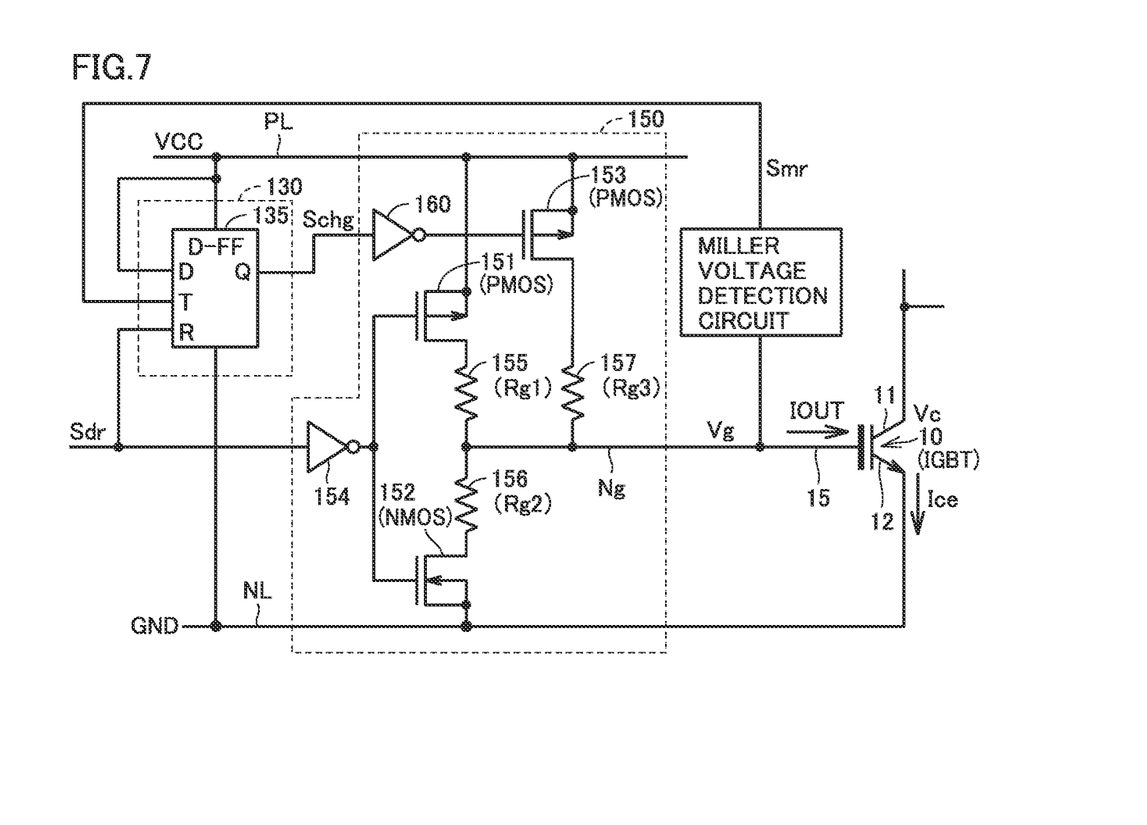
FIG. 7 is a circuit diagram illustrating a configuration example of a current output circuit shown in FIG. 3.

Referring to FIG. 7, current output circuit 150 includes a transistor 151 (PMOS), a transistor 152 (NMOS), a transistor 153 (PMOS), an inverter 154, resistance elements 155 to 157, and an inverter 160. Resistance elements 155, 156 and 157 have electric resistance values Rg1, Rg2 and Rg3, respectively.

Transistor 151 (PMOS) and transistor 152 (NMOS) are inverter-connected between high voltage line PL and low voltage line NL in the same manner as transistors 91 and 92 in drive device 90 according to the comparative example. In other words, transistor 151 is connected between high voltage line PL and node Ng. Also, transistor 152 is connected between node Ng and low voltage line NL. Transistors 151 and 152 have gates into which drive control signal Sdr inverted by inverter 154 is input in common.

Resistance element 155 is connected in series to transistor 151 between high voltage line PL and node Ng. Resistance element 156 is connected in series to transistor 152 between node Ng and low voltage line NL. Transistor 153 (PMOS) and resistance element 157 are connected in parallel with transistor 151 and resistance element 155 between node Ng and high voltage line PL. Transistor 153 has a gate to which an inversion signal of capability change signal Schg by inverter 160 is input.

Accordingly, transistor 153 (PMOS) is turned off in the time period during which capability change signal Schg is set at "0" and turned on in the time period during which capability change signal Schg is set at "1". Therefore, when semiconductor element 10 is turned on in which drive control signal Sdr is set at "1", transistor 151 is turned on and transistor 153 is turned off until the Miller period starts (time t0 to time t1 in FIG. 4). Thus, output current IOUT is supplied only by transistor 151 in the state where resistance element 155 (electric resistance value Rg1) serves as a gate resistance.

On the other hand, after the Miller period starts while semiconductor element 10 is turned on (at and after time t1), both transistors 151 and 153 are turned on. Accordingly, output current IOUT is supplied in the state where resistance elements 155 and 157 that are connected in parallel with transistors 151 and 153 serve as gate resistances. As a result, the current driving capability by the transistor is improved and the gate resistance is reduced, thereby increasing the current output capability of current output circuit 150. Consequently, output current IOUT can be increased in response to the start of the Miller period. In this way, the current output capability of current output circuit 150 can be variably controlled according to capability change signal Schg.

In current output circuit 150, when drive control signal Sdr changes from "1" to "0", transistors 151 and 153 (PMOS) are turned off while transistor 152 (NMOS) is turned on, so that gate 15 is discharged. Thereby, when semiconductor element 10 is turned off, output current IOUT (from current output circuit 150)<0. As gate voltage Vg falls due to discharge, semiconductor element 10 is turned off. When gate voltage Vg lowers to ground voltage GND, semiconductor element 10 is completely turned off, with the result that Ice=0.

Again referring to FIG. 4, at time t1, capability change signal Schg is set at "1" in response to the start of the Miller period. Thereby, the current output capability of current output circuit 150 is enhanced more than that in the time period during which capability change signal Schg is set at "0". In the example in FIG. 4, the current output capability of current output circuit 150 at capability change signal Schg="0" is assumed to be equal to the current output capability of drive device 90 according to the comparative example in FIG. 2. In FIG. 4, the waveforms of gate voltage Vg, output current IOUT, collector voltage Vc, and emitter current Ice in the comparative example in FIG. 2 are shown by dotted lines.

At and after time t1, output current IOUT is larger than that in the comparative example. Accordingly, the time period required for charging gate 15 is shortened, with the result that the Miller period is shorter than that in FIG. 2 (comparative example). Consequently, gate voltage Vg resumes rising from time t2. At and after time t2, output current IOUT for charging gradually decreases as the voltage difference between gate voltage Vg and voltage VCC decreases in response to the rise in the gate voltage.

During time t2 to time t3 after the end of the Miller period, the behaviors of the gate voltage and output current IOUT are the same as those at and after time tx in FIG. 2. During time t2 to time t3, gate voltage Vg rises, so that detection signal Smr from Miller voltage detection circuit 110 is again set at "0".

Then, at time t3, when gate voltage Vg rises to voltage VCC, semiconductor element 10 is completely turned on. Then, at the timing at which drive control signal Sdr changes from "1" to "0" to start turning-off of semiconductor element 10, capability change signal Schg is returned to "0".

In the example shown in FIG. 4, the time length from time t1 to time t3 is equal to the time length from time t1 to time ty in FIG. 2. Accordingly, in FIG. 4, during time t1 to time t3, the switching loss corresponding to the sum of the areas of diagonally shaded regions L1 and L2 occurs in semiconductor element 10.

In contrast, in the comparative example (FIG. 2), during time t1 to time ty, the switching loss corresponding to the sum of the areas of diagonally shaded regions L1, L2 and L3 occurs in semiconductor element 10. Thus, according to the drive device in the first embodiment, it is understood that the switching loss occurring when semiconductor element 10 is turned on is reduced by shortening the Miller period due to the increase in the charge current after the Miller period starts. Furthermore, output current IOUT at the start of turning-on of semiconductor element 10 (time t0) is equal to that in the comparative example (FIG. 2). Accordingly, a noise increase as compensation for suppression of switching loss is avoided.

Furthermore, by combining detection of the constant voltage period of gate voltage Vg and drive control signal Sdr, the timing at which output current IOUT increases can be appropriately set without complicating the circuit configuration for detecting the Miller period, and also without depending on the timer measuring the time period elapsed since drive control signal Sdr changed (from time t0) as in PTD 1.

In addition, in FIGS. 3 and 4, also at and after time t2 in which the end of the Miller period is detected, capability change signal Schg is maintained at "1". However, signal generation circuit 130 can also be configured such that capability change signal Schg is returned to "0" at the end of the Miller period. Also in this case, by shortening the Miller period, it becomes possible to achieve a certain effect for reducing the switching loss in semiconductor element 10. Furthermore, the rate at which gate voltage Vg rises is suppressed, which is relatively advantageous for reducing the noise at and after time t2.

On the other hand, as in FIGS. 3 and 4, by maintaining capability change signal Schg at "1" also after the end of the Miller period, the effect of shortening the time period required for turning-on of semiconductor element 10 is enhanced, so that the effect of reducing the switching loss can be enhanced.

In addition, in Miller voltage detection circuits 110a and 110b in FIGS. 5 and 6, respectively, capacitor 111 corresponds to the "capacitive element", inverter 113 (FIG. 5) and transistor 115 (FIG. 6) each correspond to one embodiment of the "active element".

Furthermore, in current output circuit 150 in FIG. 7, transistor 151 (PMOS) corresponds to one embodiment of the "first current drive transistor", and transistor 153 (PMOS) corresponds to one embodiment of the "second current drive transistor". Furthermore, resistance element 155 corresponds to the "first gate resistance", and resistance element 157 corresponds to the "second gate resistance".

Second Embodiment

In the second embodiment, a modification of the circuit configuration of the Miller voltage detection circuit will be described with reference to FIG. 8.

Figure 8:
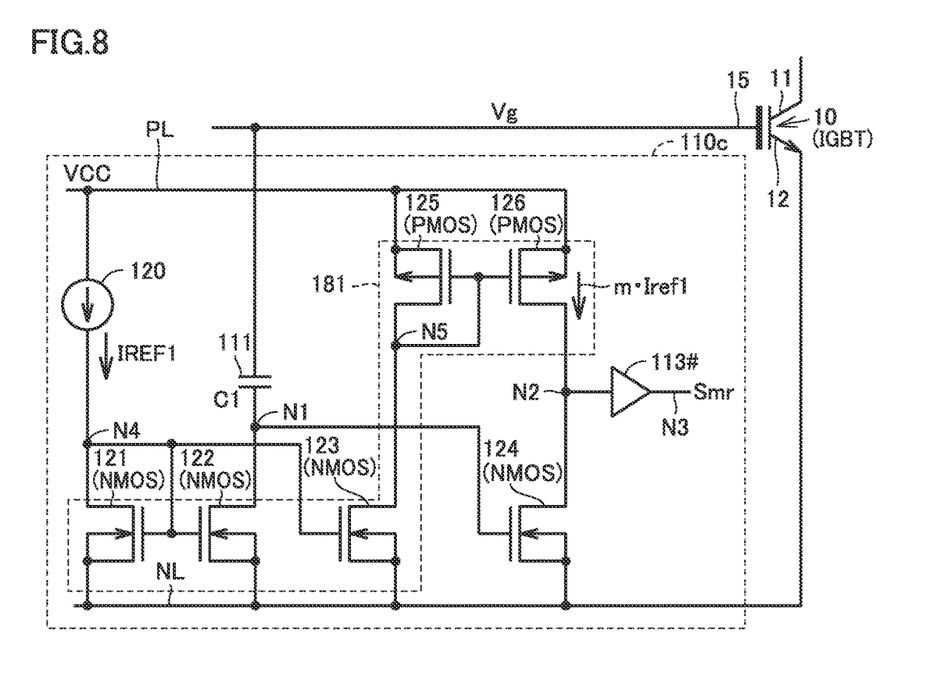
FIG. 8 is a circuit diagram illustrating a configuration example of a Miller voltage detection circuit according to the second embodiment.

Referring to FIG. 8, based on the emitter potential of semiconductor element 10 as a reference, a Miller voltage detection circuit 110c according to the second embodiment includes: a current mirror circuit 181 formed of transistors 121 to 124 (NMOS) and transistors 125 and 126 (PMOS); a capacitor 111; a constant current source 120; and a signal buffer 113#. Capacitor 111 is connected between gate 15 and node N1 in the same manner as in FIGS. 5 and 6. Transistor 122 is connected between node N1 and low voltage line NL.

Constant current source 120 is connected between high voltage line PL and node N4. Transistor 121 is connected between node N4 and low voltage line NL. Transistor 122 is connected between node N1 and low voltage line NL. Furthermore, transistor 125 is connected between high voltage line PL and node N5, and transistor 123 is connected between node N5 and low voltage line NL. Furthermore, transistor 126 is connected between high voltage line PL and node N2, and transistor 124 is connected between node N2 and low voltage line NL.

Constant current source 120 supplies a reference current IREF1 to node N4. Transistors 121 to 123 have gates that are connected in common to node N4. Furthermore, transistor 124 has a gate connected to node N1. Transistors 125 and 126 have gates connected in common to node N5. Signal buffer 113# generates detection signal Smr in response to reception of the voltage on node N2.

Then, the operation of Miller voltage detection circuit 110c will be hereinafter described.

When gate voltage Vg is fixed at ground voltage GND before semiconductor element 10 is turned on, the voltage on node N1 becomes ground voltage GND, so that transistor 124 is turned off. Current mirror circuit 181 outputs, to node N2, a current (m·IREF1) proportional to reference current IREF1 from constant current source 120. Due to this current, the voltage on node N2 rises to the same potential as voltage VCC. Thus, detection signal Smr output from signal buffer 113# is also set at "1".

In the time period during which gate voltage Vg rises, the voltage across the terminals of capacitor 111 rises, so that the voltage on node N1 rises. When transistor 124 is turned on accordingly, the current (m·IREF1) from current mirror circuit 181 is consumed by transistor 124, so that the voltage on node N2 falls. As a result, detection signal Smr output from signal buffer 113# changes from "1" to "0".

Then, when the Miller period is started and gate voltage Vg becomes constant, the voltage on node N1 falls in the same manner as before the semiconductor element is turned on. Accordingly, as transistor 124 is turned off, detection signal Smr again changes from "0" to "1".

In this way, also in Miller voltage detection circuit 110c shown in FIG. 8, by comparison between the temporal change rate of gate voltage Vg and threshold value Vr, detection signal Smr can be generated as shown in FIG. 4 for the time period during which gate voltage Vg rises and the time period during which gate voltage Vg is constant, as in Miller voltage detection circuits 110a and 110b shown in FIGS. 5 and 6, respectively.

Particularly, in Miller voltage detection circuit 110c, the voltage on node N2 (FIG. 8) at which the level ("0"/"1") of detection signal Smr is defined is driven by the current from current mirror circuit 181. As a result, the voltage change occurring on node N2 (FIG. 8) of Miller voltage detection circuit 110c is higher in rate and more stable than the voltage change caused by the capacity coupling of capacitor 111 on node N1 in each of Miller voltage detection circuits 110a (FIG. 5) and 110b (FIG. 6).

Accordingly, in Miller voltage detection circuit 110c, as compared with Miller voltage detection circuits 110a and 110b, the level ("0"/"1") of detection signal Smr can be changed at a high rate in response to the start and the end of the Miller period, and also chattering of detection signal Smr can be suppressed.

In addition, in Miller voltage detection circuit 110c in FIG. 8, capacitor 111 corresponds to the "capacitive element", node N1 corresponds to the "first node", node N2 corresponds to the "second node", and signal buffer 113# corresponds to one embodiment of the "active element". Furthermore, current mirror circuit 181 corresponds to one embodiment of the "current mirror circuit" or the "second current mirror circuit", transistor 124 (NMOS) corresponds to the "first transistor", and transistor 126 (PMOS) corresponds to the "second transistor".

Third Embodiment

In the third embodiment, a modification of the circuit configuration of current output circuit 150 will be hereinafter described with reference to FIG. 9.

Figure 9:
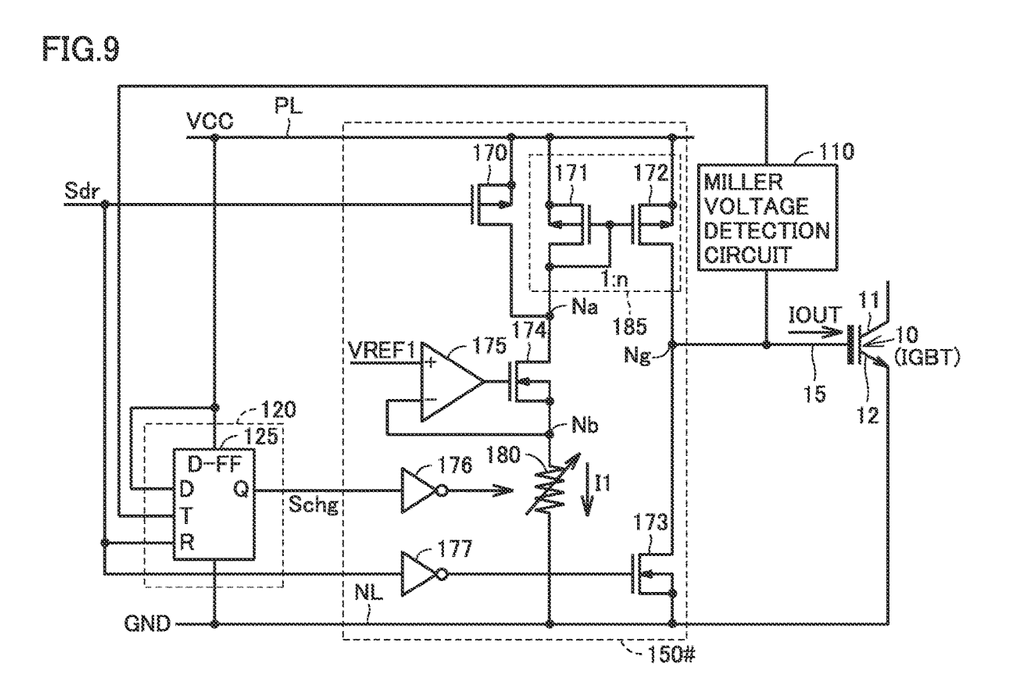
FIG. 9 is a circuit diagram illustrating a configuration example of a current output circuit according to the third embodiment.

Referring to FIG. 9, a current output circuit 150# according to the third embodiment includes transistors 170, 171 and 172 (PMOS), transistors 173 and 174 (NMOS), an operational amplifier 175, inverters 176 and 177, and a variable resistance element 180.

Transistor 172 (PMOS) and transistor 173 (NMOS) are connected in series through a node Ng between high voltage line PL and low voltage line NL. Transistor 173 (NMOS) has a gate to which an inversion signal of drive control signal Sdr by inverter 177 is input.

Transistor 171 (PMOS) is connected between a node Na and high voltage line PL. Transistors 171 and 172 have gates connected in common to node Na to thereby form a current mirror circuit 185.

On the other hand, transistor 170 (PMOS) is connected between node Na and high voltage line PL. Transistor 170 has a gate to which drive control signal Sdr is input. Accordingly, in the time period during which drive control signal Sdr is "0", when transistor 170 is turned on, the voltage on node Na reaches VCC, so that transistors 171 and 172 are turned off. Consequently, the current output to node Ng from current mirror circuit 185 is stopped. In contrast, as with transistor 152 in current output circuit 150, in the time period during which drive control signal Sdr is "0", transistor 173 is turned on in order to form a discharge path of gate 15. Accordingly, when semiconductor element 10 is turned off, output current IOUT (from current output circuit 150#) <0.

In the time period during which drive control signal Sdr is "1", transistor 170 is turned off. Thereby, current mirror circuit 185 supplies, to node Ng (that is, gate 15), a current that is proportional to (n times as high as) a current I1 flowing through node Na.

The electric resistance value of variable resistance element 180 is changed by the output signal from inverter 176 that inverts capability change signal Schg from signal generation circuit 130. Specifically, variable resistance element 180 is configured such that the electric resistance value is reduced in the timer period during which Schg="1", as compared with the time period during which Schg="0".

Transistor 174 is connected between nodes Na and Nb. Variable resistance element 180 is connected between node Nb and low voltage line NL. A voltage corresponding to the amount of the voltage drop at variable resistance element 180 occurs on node Nb.

Operational amplifier 175 amplifies the voltage difference between a predetermined reference voltage VREF1 and node Nb, and outputs the result to the gate of transistor 174 (NMOS). By controlling the gate voltage on transistor 174 in this way, current I1 on node Na is controlled such that the voltage on node Nb, that is, the amount of the voltage drop at variable resistance element 180, is kept at a fixed value (VREF1).

As a result, in the time period during which drive control signal Sdr is "1", output current IOUT from current mirror circuit 185 to gate 15 changes in accordance with the electric resistance value of variable resistance element 180 that changes according to capability change signal Schg. Specifically, when capability change signal Schg changes from "0" to "1" and the electric resistance value of variable resistance element 180 is reduced, current I1 on node Na increases, so that output current IOUT from transistor 172 accordingly increases.

In this way, the current output capability of current output circuit 150# can be variably controlled according to capability change signal Schg. Particularly, when the current output capability of current output circuit 150# is increased in the time period during which capability change signal Schg is "1", output current IOUT can be increased in response to the start of the Miller period.

Particularly, according to the circuit configuration shown in of FIG. 9, current output circuit 150# can be implemented without using gate resistances corresponding to resistance elements 155 and 157 in FIG. 7. As a result, no power loss occurs at a gate resistance. In addition to this, the current output can be changed immediately in response to the change ("0"/"1") of capability change signal Schg. Consequently, output current IOUT is immediately increased in response to the start of the Miller period, so that the effect of switching loss suppression achieved by shortening the Miller period can be further enhanced.

In current output circuit 150# in FIG. 9, the current path formed between high voltage line PL and low voltage line NL through nodes Na and Nb corresponds to the "first path", and the current path extending from high voltage line PL to node Ng corresponds to the "second path". Furthermore, current mirror circuit 185 corresponds to the "first current mirror circuit", and transistor 172 (PMOS) corresponds to one embodiment of the "current drive transistor". Also, transistor 174 (NMOS) and operational amplifier 175 can form a "control circuit" for controlling current I1 that flows through node Na such that the amount of the voltage drop at variable resistance element 180 is constant.

In the present embodiment, any one of Miller voltage detection circuits 110a, 110b, and 110c shown in FIGS. 5, 6 and 8, respectively, can also be applicable as Miller voltage detection circuit 110 shown in FIG. 3. Similarly, as current output circuit 150 in FIG. 3, any one of the circuit configuration shown in FIG. 7 and current output circuit 150# shown in FIG. 9 can also be applicable without depending on the configuration of Miller voltage detection circuit 110.

Also, for semiconductor element 10 that is controlled to be turned on and off by drive device 90 according to the present embodiment is not limited to an IGBT, but an optional voltage-driven semiconductor element by which the Miller period occurs can also be applicable.

Although the present disclosure has been described and illustrated in detail, it is clearly understood that the same is by way of illustration and example only and is not to be taken by way of limitation, the scope of the present disclosure being interpreted by the terms of the appended claims.

What is claimed is:

1. A drive device for a semiconductor element, the drive device comprising:
   a current output circuit to output, in accordance with a drive control signal for controlling the semiconductor element to be turned on and off, a charge current to a gate of the semiconductor element when the semiconductor element is turned on, the drive control signal being set at a first level when the semiconductor element is turned off, and set at a second level when the semiconductor element is turned on;
   a detection circuit to detect a constant voltage period during which a temporal change rate of a voltage on the gate is lower than a threshold value; and
   a signal generation circuit to generate, based on a detection signal output from the detection circuit and the drive control signal, a capability change signal for controlling a current output capability of the current output circuit, wherein
   the signal generation circuit generates the capability change signal so as to increase the current output capability upon detection of the constant voltage period by the detection circuit, after the drive control signal changes from the first level to the second level,
   the current output circuit electrically connects the gate of the semiconductor element to a first voltage line, through which a first voltage is supplied, in a time period during which the drive control signal is at the second level, and
   the detection circuit includes
      a capacitive element connected between the gate and a first node,
      a resistance element electrically connected between the first node and a second voltage line through which a second voltage lower than the first voltage is supplied, and
      an active element to drive the detection signal to one of a first level and a second level in accordance with a voltage on the first node.

2. The drive device for a semiconductor element according to claim 1, wherein
   the capability change signal is set at one of a first level and a second level,
   the current output circuit provides the current output capability so as to be higher in a time period during which the capability change signal is at the second level than in a time period during which the capability change signal is at the first level, and
   the signal generation circuit
      initializes the capability change signal to the first level when the drive control signal changes from the second level to the first level, and
      changes the capability change signal from the first level to the second level upon detection of the constant voltage period by the detection circuit in a time period during which the drive control signal is at the second level.

3. The drive device for a semiconductor element according to claim 1, wherein
   the capability change signal is set at one of a first level and a second level,
   the current output circuit provides the current output capability so as to be higher in a time period during which the capability change signal is at the second level than in a time period during which the capability change signal is at the first level, and
   the signal generation circuit
      initializes the capability change signal to the first level when the drive control signal changes from the second level to the first level, and
      changes the capability change signal from the first level to the second level upon detection of the constant voltage period by the detection circuit in a time period during which the drive control signal is at the second level.

4. The drive device for a semiconductor element according to claim 1, wherein
   the current output circuit includes
      a first current drive transistor and a second current drive transistor that are connected in parallel between the gate of the semiconductor element and a first voltage line through which a first voltage is supplied,
      a first gate resistance connected in series to the first current drive transistor between the first voltage line and the gate, and
      a second gate resistance connected in series to the second current drive transistor between the first voltage line and the gate,
   the first current drive transistor is turned off in a time period during which the drive control signal is at the first level, and turned on in a time period during which the drive control signal is at the second level, and
   in response to the capability change signal, the second current drive transistor is turned on in a time period during which the current output capability is increased upon detection of the constant voltage period.

5. The drive device for a semiconductor element according to claim 4, wherein
   the capability change signal is set at one of a first level and a second level,
   the current output circuit provides the current output capability so as to be higher in a time period during which the capability change signal is at the second level than in a time period during which the capability change signal is at the first level, and
   the signal generation circuit
      initializes the capability change signal to the first level when the drive control signal changes from the second level to the first level, and
      changes the capability change signal from the first level to the second level upon detection of the constant voltage period by the detection circuit in a time period during which the drive control signal is at the second level.

6. A drive device for a semiconductor element, the drive device comprising:
   a current output circuit to output, in accordance with a drive control signal for controlling the semiconductor element to be turned on and off, a charge current to a gate of the semiconductor element when the semiconductor element is turned on, the drive control signal being set at a first level when the semiconductor element is turned off, and set at a second level when the semiconductor element is turned on;

a detection circuit to detect a constant voltage period during which a temporal change rate of a voltage on the gate is lower than a threshold value; and a signal generation circuit to generate, based on a detection signal output from the detection circuit and the drive control signal, a capability change signal for controlling a current output capability of the current output circuit, wherein the signal generation circuit generates the capability change signal so as to increase the current output capability upon detection of the constant voltage period by the detection circuit, after the drive control signal changes from the first level to the second level, the current output circuit includes a first current drive transistor and a second current drive transistor that are connected in parallel between the gate of the semiconductor element and a first voltage line through which a first voltage is supplied, a first gate resistance connected in series to the first current drive transistor between the first voltage line and the gate, and a second gate resistance connected in series to the second current drive transistor between the first voltage line and the gate, the first current drive transistor is turned off in a time period during which the drive control signal is at the first level, and turned on in a time period during which the drive control signal is at the second level, and in response to the capability change signal, the second current drive transistor is turned on in a time period during which the current output capability is increased upon detection of the constant voltage period, the detection circuit includes a capacitive element connected between the gate and a first node, a resistance element electrically connected between the first node and a second voltage line through which a second voltage lower than the first voltage is supplied, and an active element to drive the detection signal to one of a first level and a second level in accordance with a voltage on the first node.

7. The drive device for a semiconductor element according to claim 6, wherein the capability change signal is set at one of a first level and a second level, the current output circuit provides the current output capability so as to be higher in a time period during which the capability change signal is at the second level than in a time period during which the capability change signal is at the first level, and the signal generation circuit initializes the capability change signal to the first level when the drive control signal changes from the second level to the first level, and changes the capability change signal from the first level to the second level upon detection of the constant voltage period by the detection circuit in a time period during which the drive control signal is at the second level.

8. A drive device for a semiconductor element, the drive device comprising:

a current output circuit to output, in accordance with a drive control signal for controlling the semiconductor element to be turned on and off, a charge current to a gate of the semiconductor element when the semiconductor element is turned on, the drive control signal being set at a first level when the semiconductor element is turned off, and set at a second level when the semiconductor element is turned on;

a detection circuit to detect a constant voltage period during which a temporal change rate of a voltage on the gate is lower than a threshold value; and a signal generation circuit to generate, based on a detection signal output from the detection circuit and the drive control signal, a capability change signal for controlling a current output capability of the current output circuit, wherein the signal generation circuit generates the capability change signal so as to increase the current output capability upon detection of the constant voltage period by the detection circuit, after the drive control signal changes from the first level to the second level, the current output circuit includes a first current drive transistor and a second current drive transistor that are connected in parallel between the gate of the semiconductor element and a first voltage line through which a first voltage is supplied, a first gate resistance connected in series to the first current drive transistor between the first voltage line and the gate, and a second gate resistance connected in series to the second current drive transistor between the first voltage line and the gate, the first current drive transistor is turned off in a time period during which the drive control signal is at the first level, and turned on in a time period during which the drive control signal is at the second level, and in response to the capability change signal, the second current drive transistor is turned on in a time period during which the current output capability is increased upon detection of the constant voltage period, the detection circuit includes a capacitive element connected between the gate and a first node, a constant current circuit to supply a reference current, a current mirror circuit to cause an output current proportional to the reference current to flow through a second node, a first transistor connected between the second node and a second voltage line through which a second voltage lower than the first voltage is supplied, the first transistor having a gate connected to the first node, and an active element to drive the detection signal to one of a first level and a second level in accordance with a voltage on the second node, the current mirror circuit includes a second transistor electrically connected between the first voltage line and the second node, and the second transistor supplies the output current through the first voltage line to the second node when the first transistor is turned on.

9. The drive device for a semiconductor element according to claim 8, wherein the capability change signal is set at one of a first level and a second level, the current output circuit provides the current output capability so as to be higher in a time period during which the capability change signal is at the second level than in a time period during which the capability change signal is at the first level, and the signal generation circuit initializes the capability change signal to the first level when the drive control signal changes from the second level to the first level, and changes the capability change signal from the first level to the second level upon detection of the constant voltage period by the detection circuit in a time period during which the drive control signal is at the second level.

* * * * *